United States Patent
Jones-Albertus et al.

(10) Patent No.: US 9,153,724 B2
(45) Date of Patent: Oct. 6, 2015

(54) REVERSE HETEROJUNCTIONS FOR SOLAR CELLS

(75) Inventors: Rebecca E. Jones-Albertus, Mountain View, CA (US); Michael J. Sheldon, San Jose, CA (US)

(73) Assignee: Solar Junction Corporation, San Jose, CA (US)

( * ) Notice: Subject to any disclaimer, the term of this patent is extended or adjusted under 35 U.S.C. 154(b) by 213 days.

(21) Appl. No.: 13/442,146

(22) Filed: Apr. 9, 2012

(65) Prior Publication Data

US 2013/0263923 A1  Oct. 10, 2013

(51) Int. Cl.
*H01L 31/042* (2014.01)
*H01L 31/0725* (2012.01)
*H01L 31/0735* (2012.01)

(52) U.S. Cl.
CPC ........ *H01L 31/0725* (2013.01); *H01L 31/0735* (2013.01); *Y02E 10/544* (2013.01)

(58) Field of Classification Search
CPC ........ H01L 31/00–31/078; Y02E 10/50–10/60
USPC .................................................. 136/243–265
See application file for complete search history.

(56) References Cited

U.S. PATENT DOCUMENTS

| | | | |
|---|---|---|---|
| 4,404,421 A | 9/1983 | Fraas | |
| 4,881,979 A | 11/1989 | Lewis | |
| 4,935,384 A | 6/1990 | Wanlass | |
| 5,009,719 A | 4/1991 | Yoshida | |
| 5,016,562 A | 5/1991 | Madan et al. | |
| 5,166,761 A | 11/1992 | Olson et al. | |
| 5,223,043 A | 6/1993 | Olson et al. | |
| 5,316,593 A | 5/1994 | Olson et al. | |
| 5,342,453 A | 8/1994 | Olson et al. | |
| 5,376,185 A | 12/1994 | Wanlass | |
| 5,405,453 A | 4/1995 | Ho et al. | |
| 5,689,123 A | 11/1997 | Major et al. | |
| 5,800,630 A | 9/1998 | Vilela et al. | |
| 5,911,839 A | 6/1999 | Tsai et al. | |
| 5,935,345 A | 8/1999 | Kuznicki | |
| 5,944,913 A | 8/1999 | Hou et al. | |

(Continued)

FOREIGN PATENT DOCUMENTS

| | | |
|---|---|---|
| JP | 63100781 A | 5/1988 |
| JP | 06061513 | 3/1994 |

(Continued)

OTHER PUBLICATIONS

Bank, et al., "Molecular-beam epitaxy growth of low-threshold cw GaInNAsSb lasers at 1.5 μm," pp. 1337-1340, J. Vac. Sci. Technol. B 23(3), May/Jun. 2005.

(Continued)

*Primary Examiner* — Bach Dinh

(57) ABSTRACT

In a solar cell having one or more subcells, at least one subcell is provided with a reverse heterojunction, the reverse heterojunction being formed with an emitter and an adjacent base, wherein the emitter has a band gap that is at least 10 meV lower than that of the adjacent base in order to reduce sheet resistance of the emitter and/or increase the subcell current with minimal effect on the open-circuit voltage. Because of the increase in current, the decrease in emitter sheet resistance, and relatively unchanged open-circuit voltage of the subcell, the efficiency of a solar cell employing one or more subcells with reverse heterojunctions is enhanced.

8 Claims, 5 Drawing Sheets

(56) References Cited

U.S. PATENT DOCUMENTS

| | | | |
|---|---|---|---|
| 6,150,603 | A | 11/2000 | Karam et al. |
| 6,252,287 | B1 | 6/2001 | Kurtz et al. |
| 6,281,426 | B1 | 8/2001 | Olson et al. |
| 6,340,788 | B1 | 1/2002 | King et al. |
| 6,504,091 | B2 | 1/2003 | Hisamatsu et al. |
| 6,617,618 | B2 | 9/2003 | Sato |
| 6,660,928 | B1 | 12/2003 | Patton et al. |
| 6,756,325 | B2 | 6/2004 | Bour et al. |
| 6,764,926 | B2 | 7/2004 | Takeuchi et al. |
| 6,765,238 | B2 | 7/2004 | Chang et al. |
| 6,787,385 | B2 | 9/2004 | Barber et al. |
| 6,815,736 | B2 | 11/2004 | Mascarenhas |
| 6,951,819 | B2 | 10/2005 | Iles et al. |
| 7,071,407 | B2 | 7/2006 | Faterni et al. |
| 7,119,271 | B2 | 10/2006 | King et al. |
| 7,122,733 | B2 | 10/2006 | Narayanan et al. |
| 7,122,734 | B2 | 10/2006 | Fetzer et al. |
| 7,123,638 | B2 | 10/2006 | Leary et al. |
| 7,126,052 | B2 | 10/2006 | Fetzer et al. |
| 7,255,746 | B2 | 8/2007 | Johnson et al. |
| 7,279,732 | B2 | 10/2007 | Meng et al. |
| 7,709,287 | B2 | 5/2010 | Fatemi et al. |
| 7,727,795 | B2 | 6/2010 | Stan et al. |
| 7,807,921 | B2 | 10/2010 | Fetzer et al. |
| 7,842,881 | B2 | 11/2010 | Comfeld et al. |
| 8,067,687 | B2 | 11/2011 | Wanlass |
| 8,575,473 | B2 | 11/2013 | Jones et al. |
| 2002/0000546 | A1 | 1/2002 | Sato |
| 2002/0195137 | A1 | 12/2002 | King et al. |
| 2003/0070707 | A1 | 4/2003 | King et al. |
| 2003/0145884 | A1 | 8/2003 | King et al. |
| 2004/0045598 | A1 | 3/2004 | Narayanan et al. |
| 2004/0130002 | A1 | 7/2004 | Weeks et al. |
| 2004/0200523 | A1 | 10/2004 | King et al. |
| 2005/0155641 | A1 | 7/2005 | Fafard |
| 2005/0274409 | A1 | 12/2005 | Fetzer et al. |
| 2006/0144435 | A1 | 7/2006 | Wanlass |
| 2006/0162768 | A1 | 7/2006 | Wanlass et al. |
| 2007/0034853 | A1 | 2/2007 | Robbins et al. |
| 2007/0131275 | A1 | 6/2007 | Kinsey et al. |
| 2007/0227588 | A1 | 10/2007 | Gossard et al. |
| 2008/0035939 | A1 | 2/2008 | Puetz et al. |
| 2008/0149173 | A1 | 6/2008 | Sharps |
| 2008/0245400 | A1 | 10/2008 | Li |
| 2008/0257405 | A1 | 10/2008 | Sharps |
| 2009/0001412 | A1 | 1/2009 | Nagai et al. |
| 2009/0014061 | A1 | 1/2009 | Harris et al. |
| 2009/0057721 | A1 | 3/2009 | Miura et al. |
| 2009/0078310 | A1 | 3/2009 | Stan et al. |
| 2009/0145476 | A1 | 6/2009 | Fetzer et al. |
| 2009/0155952 | A1 | 6/2009 | Stan et al. |
| 2009/0229659 | A1 | 9/2009 | Wanlass et al. |
| 2009/0255575 | A1 | 10/2009 | Tischler |
| 2009/0255576 | A1 | 10/2009 | Tischler |
| 2009/0272438 | A1 | 11/2009 | Cornfeld |
| 2009/0288703 | A1 | 11/2009 | Stan et al. |
| 2010/0087028 | A1 | 4/2010 | Porthouse et al. |
| 2010/0096001 | A1 | 4/2010 | Sivananthan et al. |
| 2010/0180936 | A1 | 7/2010 | Kim |
| 2010/0218819 | A1 | 9/2010 | Farmer et al. |
| 2010/0282305 | A1 | 11/2010 | Sharps et al. |
| 2010/0282306 | A1 | 11/2010 | Sharps et al. |
| 2010/0319764 | A1 | 12/2010 | Wiemer et al. |
| 2011/0023958 | A1 | 2/2011 | Masson et al. |
| 2011/0114163 | A1 | 5/2011 | Wiemer et al. |
| 2011/0210313 | A1 | 9/2011 | Fujii et al. |
| 2011/0232730 | A1 | 9/2011 | Jones et al. |
| 2011/0303268 | A1 | 12/2011 | Tan et al. |
| 2012/0031478 | A1* | 2/2012 | Boisvert et al. ............... 136/255 |
| 2012/0103403 | A1 | 5/2012 | Misra et al. |
| 2012/0211071 | A1 | 8/2012 | Newman et al. |
| 2012/0216858 | A1 | 8/2012 | Jones-Albertus et al. |
| 2012/0216862 | A1 | 8/2012 | Abou-Kandil et al. |
| 2012/0227797 | A1 | 9/2012 | Stan et al. |
| 2012/0285526 | A1 | 11/2012 | Jones-Albertus et al. |
| 2013/0118546 | A1 | 5/2013 | Jones-Albertus et al. |
| 2013/0118566 | A1 | 5/2013 | Jones-Albertus et al. |
| 2013/0220409 | A1 | 8/2013 | Jones-Albertus et al. |

FOREIGN PATENT DOCUMENTS

| | | |
|---|---|---|
| JP | 06061516 | 3/1994 |
| JP | 10012905 | 1/1998 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |

OTHER PUBLICATIONS

Bertness et al., "29.5%-Efficient GaInP/GaAs Tandem Solar Cells," Applied Physics Letters, vol. 65, Aug. 22, 1994, pp. 989-991.

Cotal et al., "III-V multijunction solar cells for concentrating photovoltaics" pp. 174-192, www.rsc.org/ees, Energy and Environmental Science 2, (2009).

Ferguson et al., Nonradiative Recombination in 1.56 μm GaIn-NAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Friedman et al., "Analysis of Depletion-Region Collection in GaIn-NAs Solar Cells," pp. 691-694, Conference Record of the Thirty-first IEEE Photovoltaic Specialists Conference, Lake Buena Vista, Florida, Jan. 3-7, 2005.

Garcia et al., Analysis of Tellurium As N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (iIn)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 19 (2011) pp. 565-572.

Green, "Third Generation Photovoltaics: Advanced Solar Energy Conversion," pp. 95-109, Springer Publishing, Berlin, Germany (2003).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Gu et al., "Gas Source Growth and Doping Characteristics of AlInP on GaAs" Materials Science and Engineering B 131 (2006), pp. 49-53.

Harris Jr. et al., "Development of GaInNAsSballoys: Growth, band structure, optical properties and applications," 2007, Physics Status Solidi(b), vol. 244, Issue 8, pp. 2707-2729, Jul. 6, 2007.

Hovel H.J., "Semiconductors and Semimetals", Academic Press, New York, 1975, Ch. 2, pp. 8-47.

Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.

Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.

(56) References Cited

OTHER PUBLICATIONS

Jackrel et al., "Dilute nitride GaInNAs and GaInNAsSb solar cells by molecular beam epitaxy", pp. 1-8, Journal of Applied Physics 101 (114916), Jun. 14, 2007.
Janotti et. al., Mutual Passivation of Electrically Active and Isovalent Impurities in Dilute Nitrides, Physical Review Letters 100, 045505 (2008).
King et al., "High-Voltage, Low-Current GaInP/GaInP/GaAs/GaInNAs/Ge Solar Cells" Spectrolab Inc., 2002, pp. 852-855.
King et al., "40% Efficient Metamorphic GaInP/GaInAs/Ge Multijunction Solar Cells," J. of Applied Physics Letters, May 4, 2007, 3 pages.
Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.
Kurtz et al., "Projected Performance of Three and Four-Junction Devices Using GaAs and GaInP," pp. 875-878, 26th IEEE Photovoltaics Specialists Conference, (1997).
Merrill et al., Directions and Materials Challenges in High Performance Photovoltaics, Dec. 2007, JOM Energetic Thin Films, 59, 12, 26-30.
Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.
Miyashita et al., "Improvement of GaInNAsSb films fabricated by atomic hydrogen-assisted molecular beam epitaxy", pp. 3249-3251, Journal of Crystal Growth 311, 2009.
Ng et al., 1EV GANXAS1-X-YSBY Material for Lattice-Matched III-V Solar Cell Implementation on GAAS AND GE, pp. 76-80, (2009).
Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.
Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).
Ptak et al., "Low-acceptor-Concentration GaInNAs grown by Molecular-beam Epitaxy for High-current p-i-n. solar cell applications." J. of Applied Physics, 98.094501 (2005).
Ptak et al., "Defects in GaInNAs: What We've Learned so Far" National Renewable Energy Laboratory NREL/CP-520-33555, May 2003, 7 pages.
Sabnis et al., A new roadmap for space solar cells, Industry Photovoltaics, www.compoundsemiconductor.net/csc/features-details/19735471, Aug./Sep. 2012, 5 pages.
Solar Junction Inc, "Sharp Develops Solar Cell with Word's Highest Conversion Efficiency of 35.8%" Press Release, dated Oct. 22, 2009, 3 pages.
Volz et al., Optimization of Annealing Conditions of (GaIn)(NAs) for Solar Cell Applications, pp. 2222-2228, Journal of Crystal Growth 310 (2008).
Volz et al., MOVPE growth of dilute nitride III/V semiconductors using all liquid metalorganic precursors, Journal of Crystal Growth 311 (2009), pp. 2418-2526.
Wiemer et al., "43.5% Efficient Lattice Matched Solar Cells" Proc. SPIE 810804 (2011), 5 pages.
Wistey et al., Nitrogen Plasma Optimization for High-Quality Dilute Nitrides, pp. 229-233, Journal of Crystal Growth, available online on Feb. 1, 2005 at http://www.sciencedirect.com.
Wu et al., Band Anticrossing in Highly Mismatched III-V Semiconductor Alloys, pp. 860-869, Semiconductor Science and Technology 17 (2002).
Yamaguchi et al., "Multi-junction III-V solar cells: current status and future potential", in: Solar Energy, vol. 79, issue 1, Jul. 2005.
Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).
International Search Report and Written Opinion PCT/US2008/008495 mailed Apr. 6, 2009, 5 pages.

International Preliminary Report on Patentability PCT/US2008/008495 dated Jan. 12, 2010, 5 pages.
International Search Report and Written Opinion corresponding to the PCT application No. PCT/US10/39534, date of mailing Sep. 8, 2010, 8 pages.
International Search Report and Written Opinion corresponding to the PCT application No. PCT/US10/56800, date of mailing Jan. 26, 2011, 8 pages.
International Search Report and Written Opinion corresponding to the PCT application No. PCT/US2010/061635, date of mailing Mar. 1, 2011, 7 pages.
International Search Report and Written Opinion corresponding to the PCT application No. PCT/US11/36486, date of mailing Aug. 25, 2011, 12 pages.
International Preliminary Report on Patentability for PCT Application No. PCT/US2010/056800, mailed on May 31, 2012, 6 pages.
International Search Report and Written Opinion of the International Searching Authority for PCT Application No. PCT/US12/36020, mailed on Aug. 14, 2012, 11 pages.
International Search Report and Written Opinion of the International Searching Authority for PCT Application No. PCT/US12/25307, mailed on Aug. 16, 2012, 13 pages.
Non-Final Office Action of Jun. 10, 2010 for U.S. Appl. No. 12/217,818, 15 pages.
Final Office Action of Jan. 1, 2011 for U.S. Appl. No. 12/217,818, 15 pages.
Non-Final Office Action of Oct. 5, 2012 for U.S. Appl. No. 12/944,439, 15 pages.
Non-Final Office Action of Oct. 24, 2012 for U.S. Appl. No. 12/749,076, 17 pages.
M.A. Green et al., Progress in Photovoltaics: Research and Applications 20 (2012) pp. 12-20.
U.S. Appl. No. 12/819,534, Final Office Action mailed on Sep. 9, 2013, 13 pages.
U.S. Appl. No. 12/944,439, Non-Final Office Action mailed on Aug. 13, 2014, 11 pages.
Japanese Application No. 2012-517662, Office Action mailed on Apr. 30, 2013, 5 pages. (English translation).
Japanese Application No. 2013-502560, Office Action mailed on May 7, 2014, 5 pages. (English translation).
Japanese Application No. 2013-536607, Office Action mailed on Mar. 18, 2014, 6 pages. (English translation).
Bhuiyan et al., InGaN Solar Cells: Present State of the Art and Important Challenges, IEEE Journal of Photovoltaics, vol. 2, No. 3, Jul. 2012, pp. 246-293.
Miller et al., GaAs-AIGaAs tunnel junctions for multigap cascade solar cells, Journal of Applied Physics, vol. 53, No. 1, Jan. 1982, pp. 744-748.
Cornfeld et al., "Evolution of a 2.05 eV AIGaInP Top Sub-cell for 5 and 6J-IMM Applications", Photovoltaic Specialists Conference (PVSC), 38th IEEE, Jun. 3, 2012, p. 2788-2791.
Denton et al., Vegard's Law, Physical Review, A, The American Physical Society, vol. 43 No. 6, pp. 3161-3164 (1991).
Law et al., "Future technology pathways of terrestrial III-V multijunction solar cells for concentrator photovoltaic systems," Solar Energy Materials & Solar Cells 94 (2010) pp. 1314-1318.
Friedman et al., "1-eV Solar cells with GaInNAs active layer", Journal of Crystal Growth, vol. 195, 1998, p. 409-415.
Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.
E. Wesoff, "Update: Solar Junction breaking CPV efficiency records, raising $30M", Greentech Media, Apr. 15, 2011, 4 pages.
E. Wesoff, "CPV Roundup: SolFocus funding, 5MW order for Solar Junction, GreenVolts, Amonix", Greentech Media, May 22, 2012, 3 pages.
E. Wesoff, "Record 44 percent CPV efficiency from startup Solar Junction", Greentech Media, Oct. 15, 2012, 3 pages.
Patton et al., "Development of a High Efficiency Metamorphic Triple-junction 2.1 eV/1.6 eV/1.2 eV AIGaInP/InGaAsP/InGaAs Space Solar Cell", Conference Record of the IEEE Photovoltaic

(56) References Cited

OTHER PUBLICATIONS

Specialists Conference, Institute of Electrical and Electronics Engineers Inc., May 19, 2002, vol. 29, p. 1027-1030.
Weyers et al., "Red shift of photoluminescence and absorption in dilute GaAsN alloy layers", Japan Journal of Applied Physics, vol. 31, Issue 7A, 1992, p. L853-L855.
International Search Report and Written Opinion for PCT Application No. PCT/US2013/033567, mailed on Mar. 4, 2014, 12 pages.
Non-Final Office Action dated Nov. 8, 2012 for U.S. Appl. No. 13/104,913, 12 pages.
Non-Final Office Action dated Dec. 14, 2012 for U.S. Appl. No. 13/618,496, 16 pages.
Final Office Action dated Feb. 6, 2013 for U.S. Appl. No. 13/618,496, 8 pages.
Non-Final Office Action dated Feb. 21, 2013 for U.S. Appl. No. 12/819,534, 8 pages.
Non-Final Office Action dated Feb. 15, 2013 for U.S. Appl. No. 12/914,710, 14 pages.
Notice of Allowance dated Mar. 22, 2013 for U.S. Appl. No. 13/618,496, 8 pages.
Non-Final Office Action dated Apr. 15, 2013 for U.S. Appl. No. 13/708,763, 23 pages.
Non-Final Office Action dated Apr. 25, 2013 for U.S. Appl. No. 13/708,791, 16 pages.
Non-Final Office Action dated May 15, 2013 for U.S. Appl. No. 13/739,989, 7 pages.
Final Office Action dated May 29, 2013 for U.S. Appl. No. 12/944,439, 17 pages.
Final Office Action dated Sep. 9, 2013 for U.S. Appl. No. 13/819,534, 13 pages.
Final Office Action dated Sep. 6, 2013 for U.S. Appl. No. 12/914,710, 17 pages.
Final Office Action dated Oct. 2, 2013 for U.S. Appl. No. 13/104,913, 12 pages.
Final Office Action dated Oct. 1, 2013 for U.S. Appl. No. 13/708,791, 15 pages.
Amendment, Affidavits under 37 C.F.R. §132, and Information Disclosure Statement filed Nov. 2013 for U.S. Appl. No. 13/739,989, 51 pages.
Final Office Action dated Feb. 26, 2014, for U.S. Appl. No. 13/739,989, 16 pages.
Non-Final Office Action dated Dec. 31, 2013, for U.S. Appl. No. 13/370,500, 7 pages.
Notice of Allowance dated Feb. 21, 2014, for U.S. Appl. No. 13/104,913, 8 pages.
Non-Final Office Action dated Feb. 20, 2014, for U.S. Appl. No. 13/678,389, 13 pages.
Notice of Allowance dated Feb. 20, 2014, for U.S. Appl. No. 13/708,763, 9 pages.
Yuen, "The role of antimony on properties of widely varying GaInNAsSb compositions", Journal of Applied Physics, May 2006, vol. 99, p. 093504-1 to 093804-8.
Notice of Allowance for U.S. Appl. No. 13/708,791, mailed on Oct. 31, 2014, 8 pages.
Notice of Allowance for U.S. Appl. No. 13/370,500, mailed on Sep. 22, 2014, 10 pages.
Notice of Allowance for U.S. Appl. No. 13/739,989 mailed on Sep. 30, 2014, 9 pages.

* cited by examiner

FIG. 5

|  | Homojunction | Reverse Heterojunction |
|---|---|---|
| Short-circuit current at 1 sun (mA/cm$^2$) | 10.88 | 11.08 |
| Open-circuit voltage at 1 sun (V) | 1.448 | 1.461 |
| Sheet resistance (ohms) | 1140 | 560 |

FIG. 6

|  | Homojunction | Reverse Heterojunction |
|---|---|---|
| Fill Factor at 1 sun (%) | 87.8 | 88.0 |
| Fill Factor at 600 suns (%) | 74.7 | 76.1 |
| Fill Factor at 1200 suns (%) | 61.7 | 65.9 |

REVERSE HETEROJUNCTIONS FOR SOLAR CELLS

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

1. Field of Invention

The invention generally relates to photovoltaic solar cells and, more particularly, to high-efficiency photovoltaic solar cells based on III-V semiconductor compounds.

2. Description of Related Art

Solar cells based on III-V semiconductor compounds have demonstrated high efficiencies for the generation of electricity from solar radiation. Known single junction solar cells formed primarily of III-V materials have reached efficiencies up to 28.3% at 1 sun solar intensity. Known multijunction III-V solar cells have reached 36.9% efficiency at 1 sun and 43.5% under concentrated sunlight equivalent to several hundred suns (see M. A. Green et al., Progress in Photovoltaics: Research and Applications 20 (2012) 12-20). Such efficiency and power achievements make it possible to apply this technology to the space and terrestrial energy markets. The solar cells with the highest efficiencies to date have employed three subcells having different energy band gaps and arranged to permit each subcell to absorb a different part of the solar spectrum.

Each subcell of a known multijunction solar cell of interest comprises several associated layers, typically including a window, emitter, base, and back surface field (BSF). These terms are known to those skilled in the art and do not need further definition here. Each of the foregoing layers may itself include one or more sublayers. The window and emitter are of one doping polarity (e.g., n-type) and the base and back surface field are of the opposite polarity (e.g., p-type), with a p-n or n-p junction formed between the base and the emitter. If an intrinsic region exists between the doped regions of the emitter and the base, then it may be considered a p-i-n or n-i-p junction, as is well known to those skilled in the art. Those skilled in the art will also recognize that subcells may also be constructed without all of the foregoing layers. For example, subcells may be constructed without a window or without a back surface field. The subcell is typically designed such that the majority of the light absorption occurs in the emitter and base layers, which ideally have high quantum efficiencies.

When reference is made to the stacking order of subcells from top to bottom, the top subcell is defined to be the subcell closest to the light source during operation of the solar cell, and the bottom subcell is defined to be the subcell furthest from the light source. Relative terms like "above," "below," "upper," and "lower" also refer to position in the stack with respect to the light source. A solar cell with only one subcell is known as a single junction solar cell. When there is more than one subcell, such subcells are typically connected in series by tunnel junctions with contacts made to the top and bottom of the stack. However, other contact configurations are possible.

In the prior art, the emitter and the base of a given subcell are either formed of the same material (e.g., GaAs), or the emitter is formed of a material with a higher band gap than that of the base. In the former case, the emitter-base junction is a homojunction, while in the latter case it is a heterojunction. Where heterojunctions are used in the prior art, the teaching is typically that having an emitter with a higher band gap than the base improves efficiency. An example of the prior heterojunction design is given in U.S. Pat. No. 5,316,593 to Olson et al. and U.S. Pat. No. 5,342,453 to Olson, where the emitter is AlInGaP with a band gap of at least 1.8 eV, and the base is GaAs with a band gap of 1.42 eV. Another example is in U.S. Pat. No. 7,071,407 to Fatemi et al., where the emitter of the middle subcell is formed of InGaP, with a band gap between 1.8-1.9 eV, while the base is InGaAs, with a band gap of 1.4 eV. In U.S. Patent Publication US2009/0078310, Stan and Cornfeld describe a middle subcell with an InGaP emitter and (In)GaAs base, and a bottom subcell with an InGaP emitter and an InGaAs base, wherein the InGaP emitters have higher band gaps than the (In)GaAs base layers. It is reported that use of a higher band gap material for the emitter can improve efficiency compared to a homojunction when the emitter of the homojunction is of poor quality. With a higher band gap emitter, the dark current is reduced and the voltage produced by the solar cell can be increased. Further, the fraction of incident light absorbed in the emitter is reduced when the band gap is increased. The base typically has a substantially higher minority carrier diffusion length than the emitter, and the overall quantum efficiency, and therefore current, of the solar cell can be improved by transferring light absorption from the emitter to the base. Fatemi et al. list additional advantages of using a heterojunction with high band gap emitter, including better lattice matching and increased transmission of light to lower subcells. Thus, where a heterojunction is used for an emitter-base junction in a solar cell in the prior art, the emitter has a higher band gap than the base, and the teaching is that this improves the voltage and current, primarily by decreasing the dark current in the emitter and increasing the transmission of light through the emitter.

Solar cell efficiency is the product of the short-circuit current, open circuit voltage and fill factor of the solar cell. One of the major factors influencing the fill factor is the series resistance. The contributions to the series resistance within a solar cell include the resistance of the metal grid, the resistance between the metal contacts and their adjacent semiconductor layers (i.e., "the contact resistance"), the lateral sheet resistance of the emitter and/or window layers of the top subcell, the resistance of the tunnel junction(s) in the solar cell (if present), and the vertical resistance due to the resistivity of the individual solar cell and buffer layers and substrate. Additional non-negligible contributions to the series resistance may be produced by the wiring and other external elements in the solar cell circuit. In addition to reducing the solar cell fill factor, the solar cell current can be indirectly reduced by higher lateral sheet resistance values because the optimization of the grid design will lead to larger fractions of the solar cell covered by the metal grid, and shadowing the cell. Because resistance losses scale with the square of the current (i.e., "$I^2R$"), they become increasingly important with larger values of current through the solar cell, such as due to increasing concentrations of light on the solar cell.

The lateral sheet resistance through the emitter and/or window layers of the solar cell is the resistance for the current to travel laterally through the emitter and/or window layers toward the metal grid, where the current is collected. Typically, when both an emitter and window are present, the emitter has a significantly lower sheet resistance than the window and most lateral current flow is through the emitter. For this reason and for simplicity, this lateral resistance will be referred to below as the "emitter sheet resistance." Discussion will focus primarily on the resistivity of the emitter, even though the window may also contribute to this resistance value. The emitter sheet resistance is an important contributor to the total series resistance of the solar cell. As mentioned above, it influences the fill factor, especially at high concentrations, as well as the grid design. When the emitter sheet resistance is included in the design of the metal grid, including the grid width and spacing, higher sheet resistance values lead to more coverage of the solar cell by the grid (i.e., "grid shadowing") in order to maximize the efficiency; this in turn reduces the solar cell current. There is a balance between grid shadowing and resistance losses that can be optimized for a given current flow through the solar cell. Particularly at concentrations of light equivalent to hundreds of suns or more, the emitter sheet resistance can have a significant impact on the overall solar cell efficiency.

Designs for three junction solar cells are rapidly approaching their practical efficiency limits. In order to reach even higher efficiencies, a greater number of subcells are evidently needed. In designing solar cells with more than three junctions, it is often advantageous for the top subcell to be higher in band gap than for a related three junction solar cell. For example, the conventional lattice-matched three junction solar cell on Ge has an InGaP top subcell, InGaAs middle subcell and Ge bottom subcell. In a related four junction, lattice-matched design on Ge, the top subcell is ideally formed of AlInGaP, with the addition of Al providing for a higher band gap than that of InGaP. However, because carrier mobility typically decreases as band gap increases, the emitter sheet resistance increases with band gap, when majority carrier concentration is held constant. Further, the maximum majority carrier concentrations that can be obtained by extrinsic doping also tend to decrease with increasing band gap, which can contribute to additional increases in the emitter sheet resistance. For example, Z. Z. Sun et al. (Journal of Crystal Growth 235 (2002) 8-14) found that the electron and hole mobilities of $(Al_{0.7}Ga_{0.3})_{0.52}In_{0.48}P$ are between factors of 2 times and 10 times lower than those of the lower band gap $Ga_{0.52}In_{0.48}P$ for the same majority electron and hole concentrations. They also reported that the maximum electron and hole concentrations achieved by doping with Si and Be, respectively, are lower for $(Al_{0.7}Ga_{0.3})_{0.52}In_{0.48}P$ than $Ga_{0.52}In_{0.48}P$. Thus, due to the decreases in both carrier concentration and mobility, the emitter sheet resistance will typically increase as the band gap of the top subcell increases. While it is nearly always advantageous to reduce the emitter sheet resistance, these increases provide further motivation for reducing emitter sheet resistance as top subcell band gap increases.

Efforts to reduce emitter sheet resistance are also becoming increasingly important for solar cells used in concentrating photovoltaic applications, where there is growing interest in using higher concentrations of sunlight that produce higher solar cell currents and therefore higher resistance losses. While employing greater numbers of subcells does typically reduce the overall solar cell current, reducing the series resistance losses, the overall efficiency can still be improved by minimizing the emitter sheet resistance. However, typical strategies for reducing emitter sheet resistance involve corresponding losses in short-circuit current, such as increasing the emitter doping level, which decreases the minority carrier diffusion length. Significant efficiency gains will only be realized when the emitter sheet resistance is decreased without reducing the short-circuit current.

In addition to the motivation to find structures with reduced emitter sheet resistance, there are a number of instances when generating additional current in one or more subcells of a multijunction solar cell, with minimal impact on the open-circuit voltage, can be advantageous. For example, in a known InGaP/InGaAs/Ge triple junction solar cell, the bottom Ge subcell has the capacity to produce more short-circuit current than the upper subcells. Structures can be found in the prior art that increase the short-circuit current of the upper subcells using quantum wells, quantum dots, or adding a lower band gap region at the back of the base of the middle junction. However, the bottom Ge cell still produces excess current, and so there is motivation to find additional methods for increasing the current of the upper subcells. In addition, for solar cells used in outer space, radiation damage can affect the short-circuit current of one subcell more than the others, making it advantageous for this subcell to have higher short-circuit current values before radiation exposure.

SUMMARY OF THE INVENTION

According to the invention, in a multijunction solar cell, at least one subcell is provided with a reverse heterojunction, the reverse heterojunction being formed with an emitter and an adjacent base, wherein the emitter has a band gap that is at least 10 meV lower than that of the adjacent base in order to reduce the sheet resistance of the emitter and/or to increase the subcell current with minimal effect on the open-circuit voltage. In another embodiment of the invention, a single junction solar cell is provided with a reverse heterojunction formed with the emitter and the base, wherein the emitter has a band gap that is at least 10 meV lower than that of the adjacent base in order to reduce sheet resistance of the emitter and/or to increase the short-circuit current with minimal effect on the open-circuit voltage. Because of the increase in current, the decrease in emitter sheet resistance, and relatively unchanged open-circuit voltage of the subcell, the efficiency of a solar cell employing one or more subcells with reverse heterojunctions is enhanced.

The invention will be better understood upon reference to the following description in connection with the accompanying drawings.

BRIEF DESCRIPTION OF THE DRAWINGS

FIG. 5 shows a comparison of the short-circuit current, open-circuit voltage and emitter sheet resistance of single junction solar cells having a homojunction or a reverse heterojunction.

FIG. 6 shows a comparison of the fill factors of single junction solar cells having a homojunction or a reverse heterojunction under 1, 600 and 1200 suns of illumination.

DETAILED DESCRIPTION OF THE INVENTION

Figure 1:
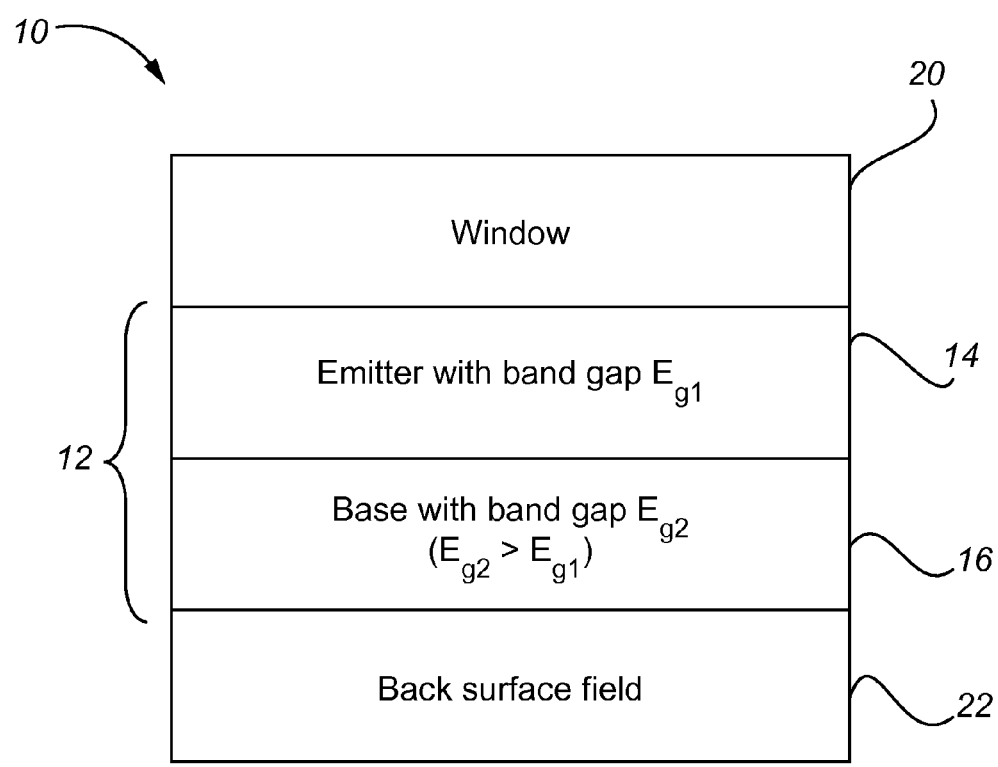
FIG. 1 is a schematic side cross-sectional view of one embodiment of the invention in form of a single subcell part of a solar cell of containing a single reverse heterojunction.

The invention discloses a reverse heterojunction for use as an emitter-base pair in a solar cell. In one embodiment as shown in FIG. 1, a reverse heterojunction 12 comprises an emitter 14 and base 16 of a subcell 10 of a solar cell with one or more subcells. This subcell 10 includes a window 20 and includes a back surface field 22. In one preferred embodiment, this subcell 10 is the top subcell of a solar cell. The disclosed heterojunction is named a "reverse heterojunction" because it comprises an emitter and base where the band gap of the emitter ($E_{g1}$) is at least 10 meV lower than the band gap of the base ($E_{g2}$), and preferably not more than 150 meV lower than the band gap of the base. This is counter to the teaching of the prior art, which specifies that the emitter should have the same band gap as the base, as in a homojunction design, or a higher band gap than that of the base. The particular design having an emitter with a higher band gap than that of the base is a heterojunction design that will be referred to hereinafter as a "standard heterojunction," because up until this point, as discussed above, heterojunctions in the prior art assumed an emitter with higher band gap. The standard heterojunction design can improve efficiency in subcells with poor emitter quality, but it does not yield improvements when the emitters are of high quality, as indicated by high quantum efficiencies and low dark currents. However, in cases where the emitter quality (i.e., the material quality of the emitter as well as the quality of the interfaces on the two sides of the emitter) is high, the reverse heterojunction is a novel design that can increase solar cell efficiency. The emitter and base of the reverse heterojunction can be formed of different compositions of the same material alloy system (e.g., an $Al_{0.1}Ga_{0.9}As$ emitter and an $Al_{0.2}Ga_{0.8}As$ base) or they may be composed of materials from different alloy systems (e.g., an InP emitter and an $In_{0.5}Al_{0.5}As$ base).

The reverse heterojunction improves efficiency by improving the short-circuit current of the subcell in which it is contained, with minimal effect on the open-circuit voltage. In the embodiment wherein the reverse heterojunction is in the top subcell of a solar cell with one or more subcells, the emitter sheet resistance is also reduced. (The improvements referenced herein are in comparison to homojunction or standard heterojunction designs.) With proper design of band gap and doping levels, the effect of the reverse heterojunction on the open-circuit voltage can be minimal. In some instances, the open circuit voltage may be slightly increased with the use of a reverse heterojunction.

Typically, electron and hole mobilities increase as band gap decreases. Thus, for the same majority carrier concentration, a lower band gap material generally has a lower resistivity. In addition, the maximum majority carrier concentration that can be achieved with extrinsic doping tends to increase with decreasing band gap, and the resulting capability to achieve higher carrier concentrations can further reduce the resistivity. Compared to an emitter of the prior art, which would have the same or higher band gap as the adjacent base, the emitter of the reverse heterojunction according to the invention has a lower band gap and a lower resistivity. When the top subcell of a solar cell with one or more subcells contains a reverse heterojunction, the lower resistivity enables a lower emitter sheet resistance that improves the solar cell efficiency by increasing the fill factor and/or the short-circuit current, as discussed above.

Compared to a homojunction or standard heterojunction of comparable design, material quality and absorption coefficient, the reverse heterojunction will produce a higher short-circuit current. This is because the emitter of the reverse heterojunction will absorb some longer wavelength light that would have been transmitted through the homojunction and standard heterojunction. Further, because carrier mobility and band gap are inversely correlated in general, the minority carrier diffusion length is typically longer in the emitter of the reverse heterojunction. This may yield an increase in the short-circuit current beyond the difference attributable simply to the absorption of longer wavelength light.

Figure 2:
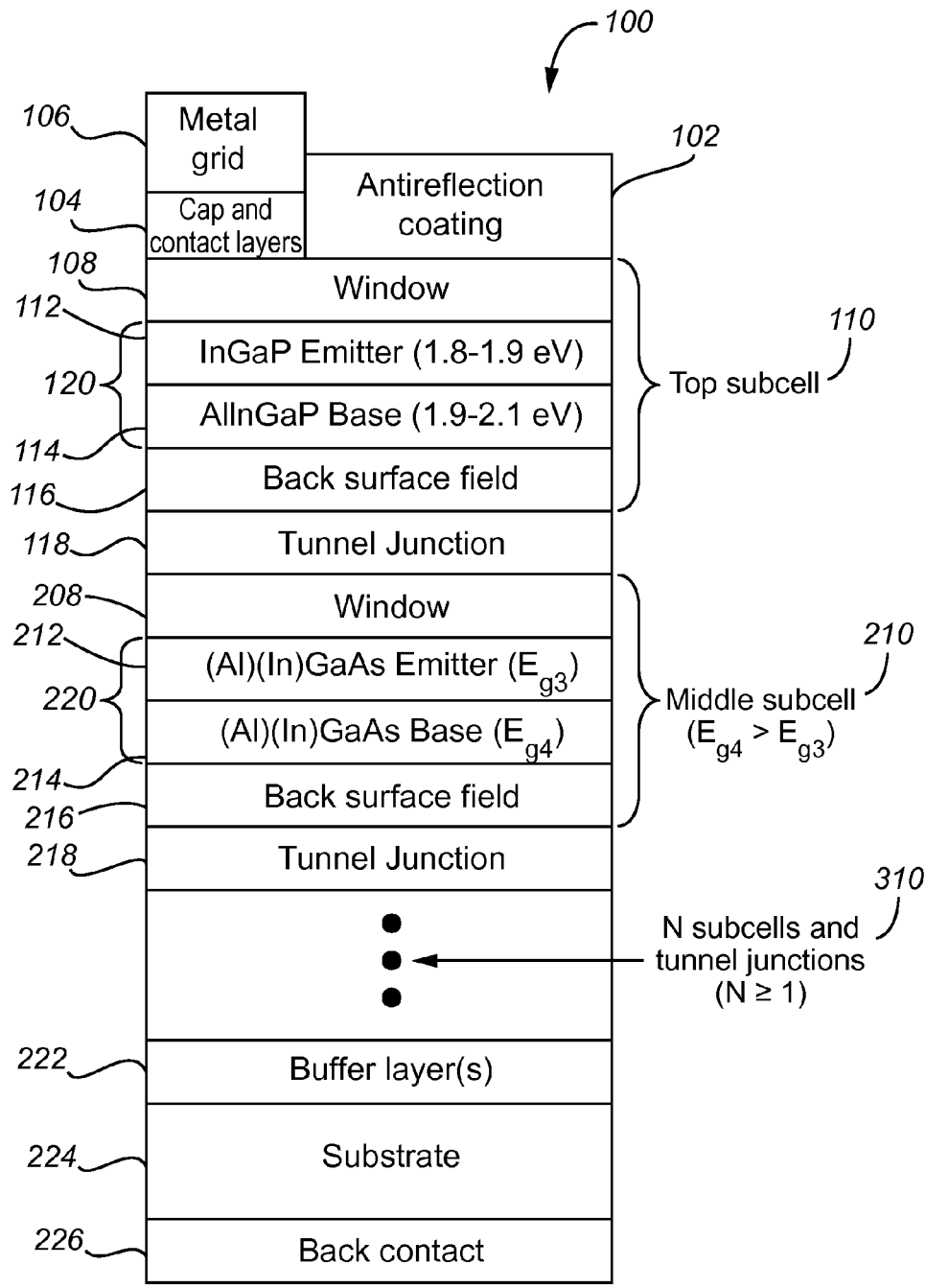
FIG. 2 is a schematic side cross-sectional view of a further embodiment of the invention in form of a solar cell containing reverse heterojunctions in adjacent subcells.

Referring to FIG. 2, a multijunction solar cell 100 is illustrated having on top an antireflection coating 102, cap and contact layers 104 and a metal grid 106. The top subcell 110 comprises a window layer 108, an emitter layer 112, a base layer 114, and a back surface field (BSF) layer 116. A tunnel junction 118 connects the top subcell 110 in series with the next subcell, which is a middle subcell 210. The emitter layer 112 and the base layer 114, in accordance with the invention, are designed as a reverse heterojunction 120. The middle subcell 210 comprises a window layer 208, an emitter layer 212, a base layer 214, and a back surface field layer 216. A tunnel junction 218 connects the middle subcell 210 to the next subcell below it. The emitter layer 212 and the base layer 214, in accordance with the invention, are designed as a reverse heterojunction 220. One or more subcells and zero or more tunnel junctions are disposed below subcell 210, followed by one or more buffer layers 222 on a substrate 224 under which is a back contact 226.

In a multijunction solar cell, the efficiency is typically maximized when the subcells are "current-matched," meaning that each of the subcells would produce the substantially same short-circuit current when operated independently of the other subcells but with the same light filtering as they see in the multijunction solar cell. To current-match a subcell in a multijunction solar cell that has a high-quality reverse heterojunction, the band gap of the base layer will be higher than in a current-matched subcell with a homojunction or standard heterojunction, in order to offset the additional current that is produced by the lower band gap emitter. (This will have a beneficial effect on the open-circuit voltage, as will be discussed below.) Alternately, if one or more subcells of a multijunction solar cell produce less current than other subcell(s), reverse heterojunctions according to the invention can be used to increase the current in those subcells and therein increase the overall current produced by the multijunction solar cell. For example, in multijunction solar cells used in space applications, the (In)GaAs subcells often suffer more radiation damage than the other subcells. Using reverse heterojunctions in those subcells can increase their short-circuit current, to help compensate for the loss upon radiation damage, increasing the overall short-circuit current of the multijunction solar cell.

The open circuit voltage ($V_{OC}$) produced by a subcell is inversely proportional to the natural logarithm of the dark current of the subcell, which includes the dark currents of the emitter and the base. Thus, $V_{OC}$ increases as the dark current decreases. The dark current of a layer is directly proportional to $$\frac{1}{N_D} e^{\frac{-E_g}{kT}}$$

where k is the Boltzmann constant and T is the temperature, and thus it decreases with increasing doping level ($N_D$) as well as with increasing band gap ($E_g$). Because the emitter is typically doped one or more orders of magnitude higher than the adjacent base, the contribution of the emitter to the total dark current of the subcell can be negligible in the case of a homojunction or standard heterojunction, unless the material quality or interface quality of the emitter is poor. In the case of a reverse heterojunction, as the band gap of the emitter decreases, its contribution to the total dark current becomes more significant. However, there will be a range of band gaps in which the contribution to the total dark current is minimal or even negligible. For example, an InGaP emitter with a band gap of 1.90 eV and a reasonable doping level of $3 \times 10^{18}$ cm$^{-3}$ can have a dark current of $1 \times 10^{-25}$ mA/cm$^{-2}$, while an InGaP base with a band gap of 1.90 eV and a reasonable doping level of $3 \times 10^{16}$ cm$^{-3}$ has a dark current of $2 \times 10^{-23}$ mA/cm$^{-2}$. In this case, the emitter dark current makes a negligible contribution to the $V_{OC}$ of the subcell; the $V_{OC}$ is dominated by the dark current of the base. With the same doping, assuming no change in material parameters, the emitter band gap would need to decrease to 1.80 eV before its contribution to the dark current would change the $V_{OC}$ by more than 10 mV, which is arguably when the change becomes significant. The dark current also depends on the carrier mobility and lifetime, which change with band gap, but their effect on the $V_{OC}$ is minimal compared to the effects of $N_D$ and $E_g$. In preferred embodiments of the invention, the emitter band gap is not more than 150 meV lower than the band gap of the base, in order to minimize the effect of the emitter dark current on the $V_{OC}$ of the solar cell. However, for certain designs, having an emitter with a band gap more than 150 meV lower than the band gap of the base may be advantageous. According to the invention, the band gap of the emitter is always at least 10 meV lower than that of the base, in order to yield the desired notable changes in solar cell performance. Differences in band gap of less than 10 meV will not significantly impact the emitter sheet resistance and are unlikely to significantly impact the short-circuit current. For reference, in typical solar cells the band gap is between about 600 meV and about 2100 meV.

Thus, compared to a comparable homojunction or standard heterojunction, a reverse heterojunction may have nearly the same $V_{OC}$. In the case where the base of the reverse heterojunction has a higher band gap than that of a comparable homojunction or standard heterojunction in order to current-match the subcell with other subcell(s) in a multijunction solar cell, the $V_{OC}$ may even increase slightly. In the case where the emitter does make a significant contribution to the dark current, an increased band gap in the base can compensate for the effect on $V_{OC}$.

By improving the fill factor and/or the short-circuit current, while having minimal effect on the open circuit voltage, a solar cell containing one or more reverse heterojunctions has a higher efficiency than a comparable solar cell with only homojunctions and standard heterojunctions.

The reverse heterojunction can yield efficiency increases both in single junction solar cells as well as solar cells with multiple subcells, i.e., multijunction solar cells. For example, a single junction solar cell with a GaAs emitter and base could realize improvements by replacing the emitter with pseudomorphic In$_{0.02}$Ga$_{0.98}$As. In multijunction solar cells, the reverse heterojunction can be employed in one or more of the subcells to improve the solar cell efficiency. Further, as multijunction solar cell designs continue to push efficiency limits and include more than three subcells, the band gap of the top subcell will often increase. In these cases, the embodiment of the invention wherein the top subcell of a solar cell includes a reverse heterojunction will be particularly useful, because it can reduce the emitter sheet resistance. As a further example, some of the emitter and base materials (listed as emitter/base) that have been determined or are reasonably predicted to be effective for reverse heterojunctions include but are not limited to: InGaP/AlInGaP, InGaP/InGaP, InP/InGaP, InP/InAlAs, InP/InAlAsSb, (Al)GaAs/InGaP, In(Al)GaAs/InGaP, InGaAs/GaAs, InGaAs/AlGaAs, Ga(In)NAsSb/(In)GaAs, Ga(In)NAs(Bi)/(In)GaAs, Ga(In)NAs(Sb)/Ga(In)NAs(Sb), InGaAs/InGaAs, GaAs/AlGaAs, InGaAs/AlInGaAs, InGaAsP/InP, (Al)(In)GaAs/AlInGaP, InGaSb/GaSb, InAlAs/InAlAs, AlInGaP/AlInGaP, AlInGaAs/AlInGaAs. The foregoing nomenclature for a III-V alloy, wherein a constituent element is shown parenthetically, such as Al in (Al)InGaP denotes a condition of variability in which that particular element can be zero. Combinations that include the same alloy system (e.g., InGaP/InGaP) indicate different alloy compositions in which the emitter has lower band gap than the base (e.g., In$_{1-x}$Ga$_x$P/In$_{1-y}$Ga$_y$P with x<y). Although the preceding list is limited to III-V alloys, the invention is not limited to use of these materials. For example, Group IV and II-VI materials may also be used.

The reverse heterojunction design is advantageous both in lattice-matched solar cells as well as metamorphic solar cells. Preferably, however, both the emitter and base of the reverse heterojunction will maintain the same lattice constant relative to one another, in order to maintain a high quality interface between them. The emitter and the base may either have substantially the same intrinsic lattice constants or the emitter may be pseudomorphic, meaning that it is in a strained state but maintains the lattice constant(s) of the base in the plane of its interface with the base.

Referring again to FIG. 2, there is one example embodiment of the invention in a multijunction solar cell with at least three subcells 110, 210, 310 (wherein 310 includes N subcells with N≥1) and wherein at least the top two subcells 110, 210 contain reverse heterojunctions 120 and 220. The top subcell 110 has its emitter 112 formed of InGaP with a band gap of approximately 1.8-1.9 eV, and the base 114 formed of (Al)InGaP with a band gap of 1.9-2.1 eV. The second subcell 210 from the top has emitter 212 formed of (Al)(In)GaAs with a band gap, $E_{g3}$, and base 214 formed of Al(In)GaAs with a band gap $E_{g4}$, where $E_{g4}>E_{g3}$. Beneath this subcell 210 are one or more additional subcells 310, and there are tunnel junctions 118, 218, etc. connecting each of the subcells 110, 210, etc., in series.

Figure 3:
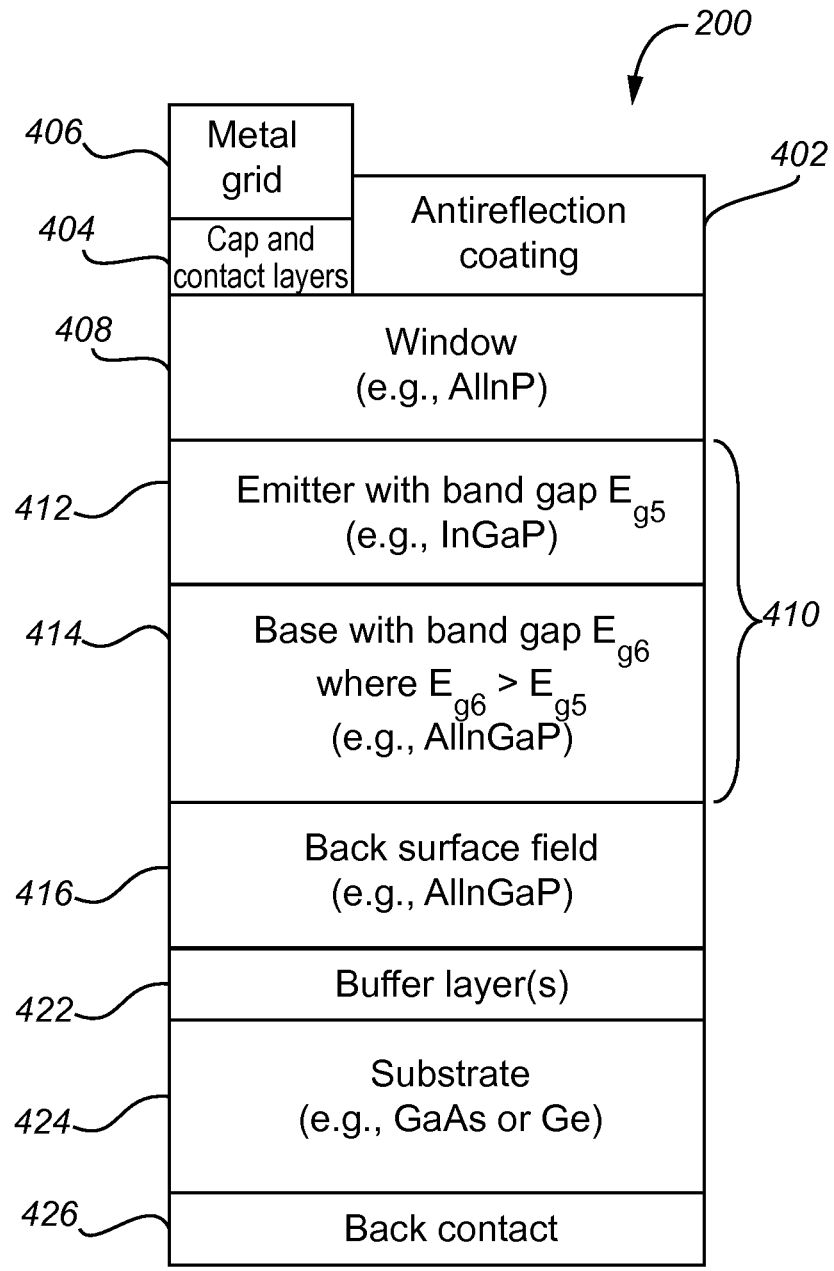
FIG. 3 is a schematic side cross-sectional view of a still further embodiment of the invention in form of a single junction solar cell containing a reverse heterojunction.

FIG. 3 depicts a full single junction solar cell 200 with a reverse heterojunction 410 comprising emitter 412 with band gap $E_{g5}$ and base 414 with band gap $E_{g6}$, where $E_{g6}>E_{g5}$. The solar cell 200 includes a window layer 408 and back surface field layer 416, as well as an antireflection coating 402, cap and contact layers 404, metal grid 406, buffer layer(s) 422, substrate 424 and back contact 426. Exemplary materials for the active layers include an AlInP window, InGaP emitter, AlInGaP base and AlInGaP back surface field.

Figure 4:
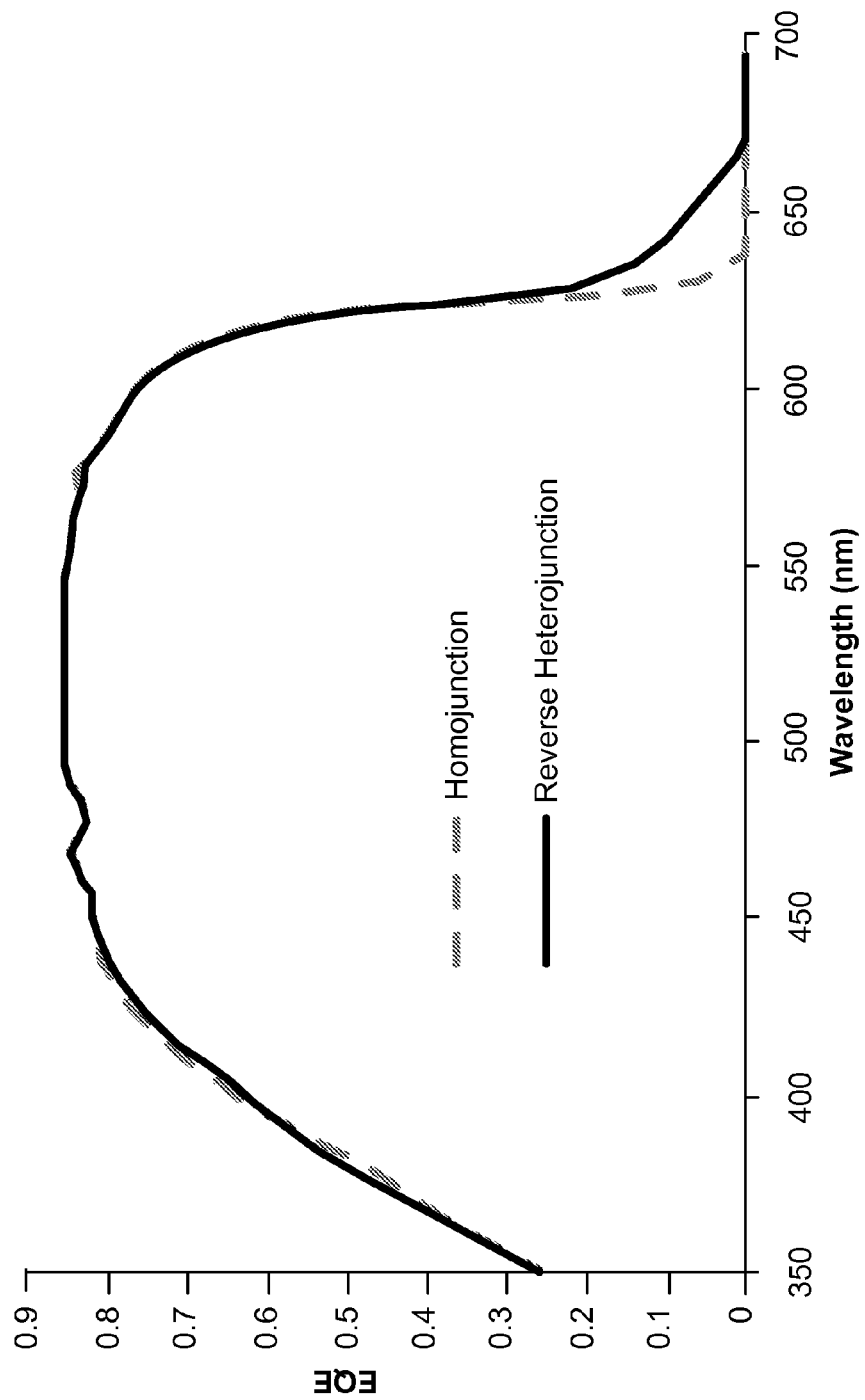
FIG. 4 is a graph showing the external quantum efficiencies of two single junction solar cells, one with a homojunction emitter and base, and one with a reverse heterojunction emitter and base.

FIG. 4 shows the external quantum efficiencies (EQE) of two single junction solar cells. The solar cells have the same structures, including the same materials, doping levels and layer thicknesses, except for the emitters. One solar cell is a homojunction with an Al$_{0.1}$In$_{0.5}$Ga$_{0.4}$P emitter and base, each with a band gap of 2.00 eV, while the other solar cell is an embodiment of the invention with the structure shown in FIG. 3: a reverse heterojunction formed of an In$_{0.5}$Ga$_{0.5}$P emitter with a band gap of 1.89 eV and an Al$_{0.1}$In$_{0.5}$Ga$_{0.4}$P base with a band gap of 2.00 eV. The EQE of the solar cell with a homojunction design is shown as a dashed line. The EQE of the solar cell with a reverse heterojunction is shown with a solid line. The EQE of the two solar cells is substantially the same except for wavelengths above 620 nm, where the EQE is higher for the reverse heterojunction. The difference in EQE corresponds to a difference in short-circuit current of 0.2 mA/cm$^2$ under the AM1.5D spectrum (FIG. 5). While this difference in EQE may not seem to be great, this difference is significant in many applications of interest. For the reverse heterojunction to match the short-circuit current of the homojunction, which is advantageous for some applications, its base would need to have a band gap that is approximately 2.01 eV, or 10 meV higher than 2.00 eV.

FIG. 5 shows the median short-circuit current, open-circuit voltage and emitter sheet resistance for two sets of 59 cells measured under 1 sun of illumination, one set with the homojunction design described in the above paragraph, with an $Al_{0.1}In_{0.5}Ga_{0.4}P$ emitter and base, each with a band gap of 2.00 eV, and one set with the reverse heterojunction design described in the above paragraph, with an $In_{0.5}Ga_{0.5}P$ emitter with a band gap of 1.89 eV and an $Al_{0.1}In_{0.5}Ga_{0.4}P$ base with a band gap of 2.00 eV. The median open-circuit voltage of the reverse heterojunctions is 13 mV lower than that of the homojunctions, even though the base layers, which dominate the dark current, are identical. The lower voltage of the reverse heterojunctions is explained by the increased contribution to the dark current from the lower band gap emitter. However, some of this voltage loss would be recovered if the band gap of the base in the reverse heterojunctions were increased by 10 meV in order to match the short-circuit current of the homojunction. Most notably, the sheet resistance of the reverse heterojunction is roughly half the value of the homojunction. The impact of this difference in sheet resistance on the fill factor increases as the concentration of sunlight on the solar cell increases.

FIG. 6 compares the fill factor and efficiency of the same two sets of cells at 1 sun, 600 suns and 1200 suns of illumination, under a spectrum designed to simulate the AM1.5D spectrum. The two sets of cells have identical grid designs. At 1 sun, the median fill factors differ by only 0.2%, with the reverse heterojunctions having a median fill factor of 88.0% while the homojunctions have a median fill factor of 87.8%. This difference in fill factor makes a negligible impact on the efficiency; the differences in short-circuit and open-circuit voltage are more significant. At higher illumination intensities, the difference in fill factors is more pronounced and is explained by the difference in emitter sheet resistance (R), which creates larger $I^2R$ losses as the current (I) increases with the illumination intensity on the cell. At 600 suns, the median fill factor of the reverse heterojunctions (76.1%) is 1.4% higher than that of the homojunctions (74.7%). Here the difference in fill factor is as significant in impact on the efficiency as the difference in short-circuit current. At the highest illumination intensity of 1200 suns, the fill factor difference is even more pronounced, again attributed to the difference in emitter sheet resistance. The median fill factor of the reverse heterojunctions (65.9%) is 4.2% higher than that of the homojunctions (61.7%). It is noted that the grid designs used on these solar cells were not optimized for these concentrations of sunlight (equivalently, illumination intensities) and these emitter sheet resistances. This causes the absolute values of the fill factors to be lower than for a more optimized grid design.

Thus, the invention discloses a reverse heterojunction structure that can improve solar cell efficiency as compared to standard heterojunction or homojunction designs. The efficiency improves largely due to increases in short-circuit current and fill factor. The effect on the open circuit voltage depends on other parameters of the solar cell design. In one embodiment of the invention, the top subcell of a solar cell with one or more subcells contains a reverse heterojunction. When these solar cells are used under concentrations of sunlight in the hundreds or thousands, the improvements in emitter sheet resistance over conventional top subcells is most pronounced. The improvements in emitter sheet resistance improve the solar cell fill factor if the grid design is held constant and can improve the short-circuit current if the grid design is re-optimized.

The invention has been explained with reference to specific embodiments. Other embodiments will be evident to those of ordinary skill in the art. It is therefore not intended for the invention to be limited, except as indicated by the appended claims.

What is claimed is:

1. A photovoltaic cell comprising at least one reverse heterojunction subcell, wherein the reverse heterojunction subcell comprises:
    an emitter characterized by an emitter bandgap and by a single emitter alloy composition; and
    a base characterized by a base bandgap and by a single base alloy composition; wherein,
    the emitter is adjacent the base;
    the emitter bandgap is 10 meV to 150 meV less than the base bandgap; and
    the emitter alloy composition and the base alloy composition comprise different alloy compositions of the same alloy system.

2. The photovoltaic cell of claim 1, wherein the at least one reverse heterojunction subcell is a top subcell of the photovoltaic cell.

3. The photovoltaic cell of claim 2, wherein,
    the emitter alloy composition comprises InGaP and the base alloy composition comprises InGaP; or
    the emitter alloy composition comprises AlInGaP and the base alloy composition comprises AlInGaP.

4. The photovoltaic cell of claim 3, wherein,
    the emitter has a band gap between 1.8 eV and 1.9 eV; and
    the base has a band gap between 1.9 eV and 2.1 eV.

5. The photovoltaic cell of claim 4, wherein,
    the emitter has a band gap of 1.9 eV; and
    the base has a band gap of 2.0 eV.

6. The photovoltaic cell of claim 1, wherein,
    the emitter alloy composition is selected from InGaAs, GaAs, AlInGaAs and AlGaAs; and
    the base alloy composition is selected from InGaAs, GaAs, AlInGaAs and AlGaAs.

7. The photovoltaic cell of claim 1, wherein the reverse heterojunction subcell is lattice matched to another subcell.

8. A method for increasing the power conversion efficiency of a photovoltaic cell comprising the steps of:
    forming a base, wherein the base is characterized by a base bandgap and by a base alloy composition; and
    forming, adjacent the base, an emitter, wherein,
        the emitter is characterized by an emitter bandgap and an emitter alloy composition;
        the emitter band gap is 10 meV to 150 meV less than the base bandgap; and
        the emitter alloy composition and the base alloy composition comprise different alloy compositions of the same alloy system.

* * * * *